United States Patent
Furuhata

(10) Patent No.: US 10,319,656 B2
(45) Date of Patent: Jun. 11, 2019

(54) SEMICONDUCTOR DEVICE AND ELECTRONIC APPARATUS ENCAPSULATED IN RESIN WITH EMBEDDED FILLER PARTICLES

(71) Applicant: SEIKO EPSON CORPORATION, Tokyo (JP)

(72) Inventor: Tomoyuki Furuhata, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 52 days.

(21) Appl. No.: 15/258,654

(22) Filed: Sep. 7, 2016

(65) Prior Publication Data

US 2017/0069557 A1 Mar. 9, 2017

(30) Foreign Application Priority Data

Sep. 8, 2015 (JP) .................. 2015-176505

(51) Int. Cl.
*H01L 23/29* (2006.01)
*H01L 23/528* (2006.01)
*H01L 23/532* (2006.01)

(52) U.S. Cl.
CPC .......... *H01L 23/295* (2013.01); *H01L 23/528* (2013.01); *H01L 23/53214* (2013.01); *H01L 23/53228* (2013.01)

(58) Field of Classification Search
CPC ................. H01L 23/295; H01L 23/528; H01L 23/53214; H01L 23/53228; H01L 23/3121; H01L 23/5283; H01L 21/56–21/568
See application file for complete search history.

(56) References Cited

U.S. PATENT DOCUMENTS

| | | | | |
|---|---|---|---|---|
| 2001/0030365 A1* | 10/2001 | Otsuka | .............. | H01L 21/76807 257/758 |
| 2011/0180901 A1 | 7/2011 | Matsumura | | |
| 2013/0147023 A1* | 6/2013 | Lin | ..................... | H01L 23/5225 257/659 |
| 2014/0252597 A1* | 9/2014 | Tsai | .................... | H01L 23/3171 257/737 |

(Continued)

FOREIGN PATENT DOCUMENTS

| | | |
|---|---|---|
| JP | H02-162755 A | 6/1990 |
| JP | 2002-353381 A | 12/2002 |
| JP | 2004-253574 A | 9/2004 |

(Continued)

*Primary Examiner* — Brigitte A Paterson
(74) *Attorney, Agent, or Firm* — Oliff PLC

(57) ABSTRACT

A semiconductor device includes a semiconductor substrate, an analog circuit block including an active element arranged in the semiconductor substrate, a metal layer having a slit or a plurality of metal interconnects arranged in parallel, positioned above the analog circuit block, and a resin layer containing a filler, positioned above at least the metal layer or the plurality of metal interconnects. In the case of forming a semiconductor device by sealing a semiconductor chip with resin having a filler mixed therein, according to this semiconductor device, it is possible to suppress lowering of the level of precision of the electric characteristics of the analog circuit, and a variation in the characteristics or a change in the characteristics, in a mold packaging process, without using special materials or production methods.

12 Claims, 6 Drawing Sheets

(56) References Cited

U.S. PATENT DOCUMENTS

2016/0079169 A1* 3/2016 Uzoh .................. H01L 23/5328
257/750

FOREIGN PATENT DOCUMENTS

| JP | 2008-034676 A | 2/2008 |
|----|---------------|--------|
| JP | 2010-141271 A | 6/2010 |
| JP | 2011-091130 A | 5/2011 |
| JP | 2011-155192 A | 8/2011 |

* cited by examiner

SEMICONDUCTOR DEVICE AND ELECTRONIC APPARATUS ENCAPSULATED IN RESIN WITH EMBEDDED FILLER PARTICLES

CROSS-REFERENCE TO RELATED APPLICATIONS

The present application claims priority to Japanese Patent Application JP 2015-176505, filed Sep. 8, 2015, the entire disclosure of which is hereby incorporated by reference herein.

BACKGROUND

1. Technical Field

Various embodiments of the present invention relate to a semiconductor device in which a semiconductor chip is sealed with resin having a filler mixed therein. Furthermore, various embodiments of the invention relates to an electronic apparatus and the like using such a semiconductor device.

2. Related Art

In a semiconductor device (IC) containing an analog circuit, a change in circuit characteristics caused by residual stress generated in a sealing process (mold packaging process) using resin having a filler mixed therein is a main factor that impedes an improvement in the level of precision of the electric characteristics of the analog circuit. The reason for this is that resin having a large coefficient of linear expansion shrinks on hardening during the forming process, thereby generating compressive stress on the surface and the inside of the IC.

In particular, since the filler is distributed in the resin non-uniformly, the compressive stress at various portions of the IC also becomes non-uniform. With the piezoelectric effect due to this compressive stress, the electric characteristics of various devices non-uniformly change. As a result, the electric characteristics of the analog circuit change between before and after the mold packaging process. Accordingly, the level of precision of the electric characteristics of the analog circuit is lowered, and a variation in the characteristics or a change in the characteristics increases.

As a related technique, JP-A-2002-353381 (paragraphs 0007 and 0008, and FIG. 1) has disclosed a semiconductor integrated circuit device that can suppress a change in characteristics such as reference voltage between before and after resin sealing. This semiconductor integrated circuit device is a semiconductor integrated circuit device in which a semiconductor chip is sealed with filler-containing resin, characterized in that the filler has a maximum particle size of 10 μm or more and 50 μm or less.

According to JP-A-2002-353381, if the maximum particle size of a filler is limited to a predetermined range, a change in the electric characteristics of an analog circuit can be suppressed. However, when the maximum particle size of the filler is limited, the production cost becomes larger than that when an ordinary filler is used. Furthermore, there is a strong demand for an improvement in the level of precision of the electric characteristics of an analog circuit, and it is required to make the level of precision higher than that of an existing IC, suppress a variation in the characteristics and a change in the characteristics, and reduce the production cost.

SUMMARY

It is a first advantage of one or more embodiments of the invention to suppress lowering of the level of precision of the electric characteristics of an analog circuit, and a variation in the characteristics and a change in the characteristics, in a mold packaging process, without using special materials or production methods, in a semiconductor device in which a semiconductor chip is sealed with resin having a filler mixed therein. Furthermore, it is a second advantage of one or more embodiments of the invention to provide an electronic apparatus and the like using such a semiconductor device.

A first aspect of the invention is directed to a semiconductor device including: a semiconductor substrate; an analog circuit block including an active element arranged in the semiconductor substrate; a metal layer having a slit or a plurality of metal interconnects arranged in parallel, positioned above the analog circuit block; and a resin layer containing a filler, positioned above at least the metal layer or the plurality of metal interconnects.

According to the first aspect of the invention, a metal layer or a plurality of metal interconnects are provided as a buffer layer above an analog circuit block. Thus, the non-uniformity of microstress that transfers from the filler to an active element and the like of the analog circuit block is suppressed, and the non-uniformity of the changes in the characteristics of the active element and the like is reduced. Accordingly, it is possible to suppress lowering of the level of precision of the electric characteristics of the analog circuit, and a variation in the characteristics and a change in the characteristics, in a mold packaging process, without using special materials or production methods.

Furthermore, in the mold packaging process, stress is generated also from the metal layer or the plurality of metal interconnects. The slit formed in the metal layer uniformizes stress that is generated from the metal layer and transfers to the active element and the like of the analog circuit block, so that the influence on the electric characteristics of the active element and the like can be mitigated. In a similar manner, if the plurality of metal interconnects are arranged in parallel, stress that is generated from the plurality of metal interconnects and transfers to the active element and the like of the analog circuit block is uniformized, so that the influence on the electric characteristics of the active element and the like can be mitigated.

In this case, it is desirable that a width of the slit or a gap between the plurality of metal interconnects is smaller than a particle size of the filler. Furthermore, it is desirable that an area of the slit of the metal layer is smaller than 20% of an area of the metal layer, or an area of a region positioned between the plurality of metal interconnects is smaller than 20% of an area of the plurality of metal interconnects. Accordingly, it is possible to lower a proportion at which microstress that transfers from the filler passes through the slit or a portion between the plurality of metal interconnects and reaches the active element and the like of the analog circuit block.

A second aspect of the invention is directed to a semiconductor device including: a semiconductor substrate; an analog circuit block including an active element arranged in the semiconductor substrate; a first metal layer positioned above the analog circuit block; a second metal layer positioned via an insulating film above the first metal layer; a metal member that fills a through hole formed through the insulating film and connects the first metal layer and the second metal layer; and a resin layer containing a filler, positioned above at least the second metal layer.

According to the second aspect of the invention, a first metal layer is provided as a buffer layer above an analog circuit block, and a second metal layer is provided as a buffer layer via an insulating film above the first metal layer. Thus, the non-uniformity of microstress that transfers from the filler to an active element and the like of the analog circuit block is suppressed, and the non-uniformity of the changes in the characteristics of the active element and the like is reduced. Accordingly, it is possible to suppress lowering of the level of precision of the electric characteristics of the analog circuit, and a variation in the characteristics and a change in the characteristics, in a mold packaging process, without using special materials or production methods.

Furthermore, in the mold packaging process, stress is generated also from the first and second metal layers. The metal member arranged between the first metal layer and the second metal layer uniformizes stress that is generated from the first and second metal layers and transfers to the active element and the like of the analog circuit block, so that the influence on the electric characteristics of the active element and the like can be mitigated.

In this case, it is desirable that a width of the metal member is smaller than a particle size of the filler. Accordingly, it is possible to lower a proportion at which microstress that transfers from the filler passes via the metal member and reaches the active element and the like of the analog circuit block.

A third aspect of the invention is directed to an electronic apparatus, including any one of the above-described semiconductor devices. According to the third aspect of the invention, it is possible to provide an electronic apparatus having stable electric characteristics with a high level of precision, using a semiconductor device in which lowering of the level of precision of the electric characteristics of the analog circuit, and a variation in the characteristics and a change in the characteristics in a mold packaging process are suppressed without using special materials or production methods.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Figure 1:
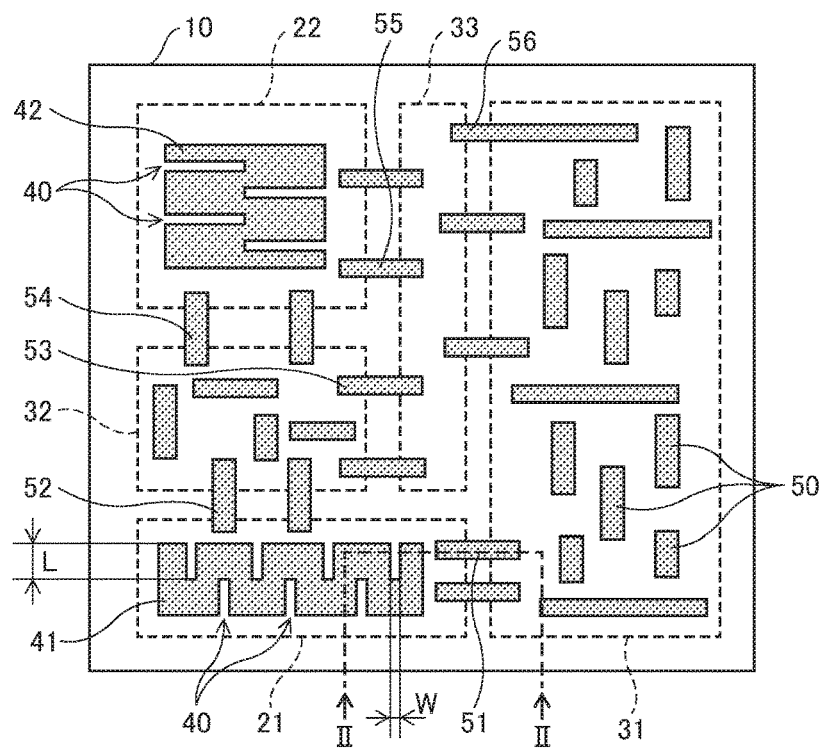
FIG. 1 is a plan view showing an example of the configuration of a semiconductor device according to a first embodiment of the invention.

The following describes embodiments of the invention in detail with reference to the drawings. Note that the same constituent elements are denoted by the same reference numerals, and a redundant description thereof has been omitted.

First Embodiment

FIG. 1 is a plan view showing an example of the configuration of a semiconductor device according to the first embodiment of the invention. Note that, in FIG. 1, in order to show the layout of a third interconnect layer, layers thereabove are omitted. As shown in FIG. 1, this semiconductor device includes a semiconductor substrate 10, and analog circuit blocks 21 and 22 and digital circuit blocks 31 to 33 arranged in the semiconductor substrate 10. The semiconductor substrate 10 is made of a semiconductor material such as silicon.

Furthermore, in the semiconductor device, the third interconnect layer includes metal layers 41 and 42 positioned respectively above the analog circuit blocks 21 and 22, a plurality of intra-block interconnects 50 positioned above the digital circuit blocks 31 to 33, a plurality of inter-block interconnects 51 to 56, and the like. As shown in FIG. 1, each of the metal layers 41 and 42 has slits 40.

Each of the intra-block interconnects 50 is a metal interconnect for establishing electrical connection inside a digital circuit block. Each of the inter-block interconnects 51 to 56 and the like is a metal interconnect for electrically connecting a plurality of circuit blocks. The metal layers 41 and 42 and the metal interconnects are made of, for example, aluminum (Al), aluminum alloy obtained by mixing approximately 0.5% of copper (Cu) in aluminum (Al), copper (Cu), or the like.

The metal layers 41 and 42 function as buffer layers against compressive stress that is generated in the mold packaging process and transfers to the circuit elements of the analog circuit blocks 21 and 22. Furthermore, the slits 40 of the metal layers 41 and 42 can uniformize stress that is generated from the metal layers 41 and 42 and transfers to the circuit elements of the analog circuit blocks 21 and 22.

Figure 2:
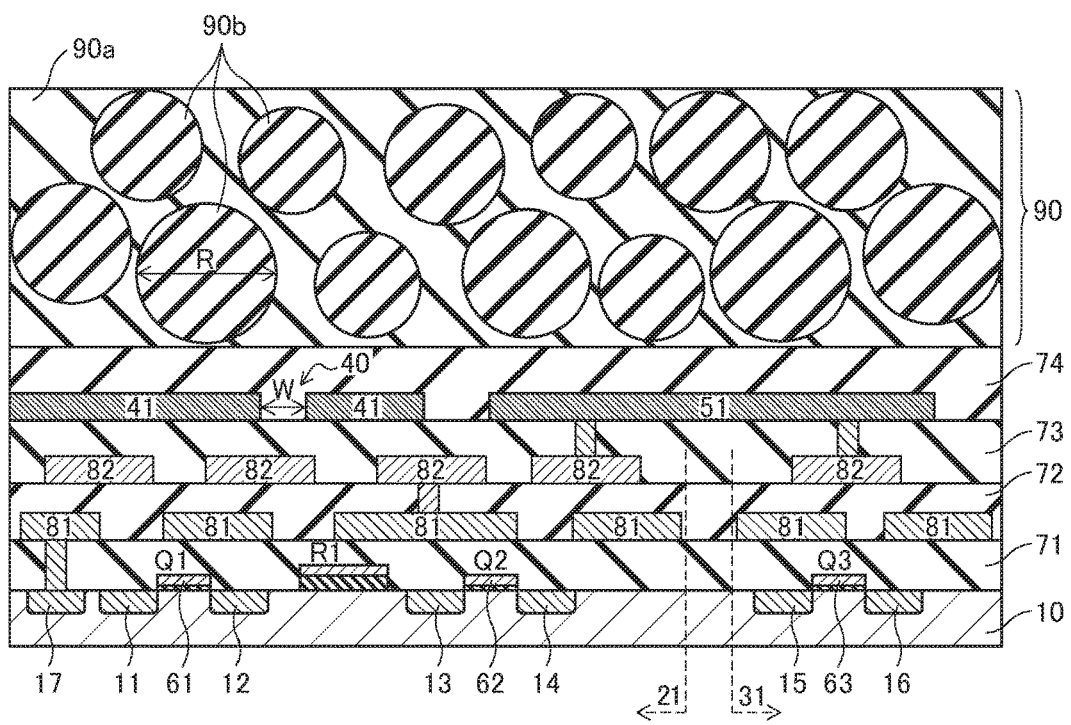
FIG. 2 is a cross-sectional view of the semiconductor device taken along the line II-II shown in FIG. 1.

FIG. 2 is a cross-sectional view of the semiconductor device taken along the line II-II shown in FIG. 1. FIG. 2 shows a part of the analog circuit block 21 and a part of the digital circuit block 31. For example, the analog circuit block 21 includes active elements such as transistors Q1 and Q2 and a passive element such as a resistor R1 arranged on the semiconductor substrate 10. Furthermore, the digital circuit block 31 includes an active element such as a transistor Q3 arranged on the semiconductor substrate 10.

As shown in FIG. 2, in the semiconductor substrate 10 of a first conductivity type, impurity diffusion regions 11 to 16 of a second conductivity type functioning as sources and drains of the transistors Q1 to Q3 and an impurity diffusion region 17 of a first conductivity type electrically connected to the semiconductor substrate 10 are formed. The first conductivity type may be P-type and the second conductivity type may be N-type, or the first conductivity type may be N-type and the second conductivity type may be P-type. Note that the impurity diffusion regions 11 to 17 may be formed in wells of a first conductivity type arranged in the semiconductor substrate 10 of a first conductivity type or second conductivity type.

Meanwhile, on the upper side of the semiconductor substrate 10, gate electrodes 61 to 63 of the transistors Q1 to Q3 are arranged via gate insulating films, and the resistor R1 is arranged via an insulating film. The gate electrodes 61 to 63 and the resistor R1 are made of, for example, a material such as polysilicon that has been imparted with conductivity by being doped with impurities. On the upper side of the semiconductor substrate 10 on which the gate electrodes 61 to 63 and the like are arranged, the inter-layer insulating film 71 is arranged.

On the upper side of the inter-layer insulating film 71, a first interconnect layer including a plurality of metal interconnects 81 is arranged. For example, the metal interconnects 81 of the first interconnect layer are electrically connected via contact holes or through holes formed through the inter-layer insulating film 71, to the impurity diffusion regions 11 to 17, the gate electrodes 61 to 63, or the like. On the upper side of the inter-layer insulating film 71 on which the first interconnect layer is arranged, an inter-layer insulating film 72 is arranged.

On the upper side of the inter-layer insulating film 72, a second interconnect layer including a plurality of metal interconnects 82 is arranged. For example, the metal interconnects 82 of the second interconnect layer are electrically connected via through holes formed through the inter-layer insulating film 72, to the metal interconnects 81 and the like of the first interconnect layer. On the upper side of the inter-layer insulating film 72 on which the second interconnect layer is arranged, an inter-layer insulating film 73 is arranged. The inter-layer insulating films 71 to 73 are made of, for example, BPSG (boron phosphorus silicon glass), silicon nitride ($Si_3N_4$), silicon dioxide ($SiO_2$), a composite film containing materials selected therefrom in combination, or the like.

On the upper side of the inter-layer insulating film 73, a third interconnect layer including the metal layer 41 positioned above the analog circuit block 21, the intra-block interconnects 50 (see FIG. 1) positioned above the digital circuit block 31, and the inter-block interconnects 51 is arranged. The metal layer 41 may not be electrically connected to other metal interconnects or circuit elements. Alternatively, the metal layer 41 may be electrically connected to the semiconductor substrate 10 so that a substrate potential is applied thereto, or may be electrically connected to a metal interconnect to which a reference potential or a power source potential of the analog circuit block 21 is supplied. Note that, in this application, "upper" and "above" refer to a direction from the main faces of the semiconductor substrate 10 toward the gate electrode 61 and the like, among the directions perpendicular to the main faces of the semiconductor substrate 10.

The intra-block interconnects 50 are electrically connected via through holes formed through the inter-layer insulating film 73, to the metal interconnects 82 of the digital circuit block 31. The inter-block interconnects 51 electrically connect the metal interconnects 82 of the analog circuit block 21 and the metal interconnects 82 of the digital circuit block 31, via through holes formed through the inter-layer insulating film 73. Furthermore, on the upper side of the inter-layer insulating film 73 on which the third interconnect layer is arranged, a protective film 74 is arranged. The protective film 74 is made of, for example, an insulating film of silicon nitride ($Si_3N_4$), silicon dioxide ($SiO_2$), a composite film containing materials selected therefrom in combination, or the like.

The thus configured semiconductor chip is sealed with a resin layer 90 in which a filler 90b is mixed in a resin 90a. Accordingly, the resin layer 90 is positioned above at least the metal layer 41, and may cover the upper face and the side faces of the semiconductor chip, or may cover the entire face of the semiconductor chip except for external connection terminals. The resin 90a may be, for example, epoxy resin or the like. The filler 90b is, for example, a fine particle such as silica particle.

If the filler 90b is mixed in the resin 90a, the strength, the coefficient of thermal expansion, and the like of the resin layer 90 can be adjusted. However, a change in circuit characteristics caused by residual stress generated in a sealing process (mold packaging process) using the resin 90a having the filler 90b mixed therein is a main factor that impedes an improvement in the level of precision of the electric characteristics of the analog circuit.

For example, if there is a point at which the filler 90b is in contact with the protective film 74, local microstress is generated directly below that point. The microstress depends on a particle size R of the filler 90b, and varies in size depending on the position. If there are circuit elements such as transistors or resistors at positions where microstress is generated, the size of stress applied to the circuit elements varies from circuit element to circuit element, and thus a change in the characteristics varies from circuit element to circuit element. Accordingly, the non-uniformity of the changes in the characteristics lowers the level of precision of the electric characteristics of the analog circuit, and induces a variation in the characteristics or a change in the characteristics.

For example, the analog circuit block 21 includes a differential amplification circuit including a differential pair of transistors, and a pair of resistors connected in series between sources of the transistors, as a low noise amplifier for amplifying weak signals. In this sort of case, if stress having different sizes is applied to the transistors or the resistors forming a pair, the differential balance of the differential amplification circuit is disrupted, which may lower the level of precision of the amplification characteristics and the like.

Thus, according to this embodiment, in the process that forms a third interconnect layer, the metal layer 41 is provided as a buffer layer above the analog circuit block 21, so that the non-uniformity of microstress that transfers from the filler 90b to the plurality of circuit elements of the analog circuit block 21 is suppressed, and the non-uniformity of the changes in the characteristics of the circuit elements is reduced. Accordingly, it is possible to suppress lowering of the level of precision of the electric characteristics of the analog circuit, and a variation in the characteristics and a change in the characteristics, in the mold packaging process, without using special materials or production methods.

Furthermore, in the mold packaging process, stress is generated also from the metal layer 41. The slits 40 formed in the metal layer 41 uniformize stress that is generated from the metal layer 41 and transfers to the plurality of circuit elements of the analog circuit block 21, so that the influence on the electric characteristics of the circuit elements can be mitigated.

In this case, it is desirable that the width W of each slit of the metal layer 41 is smaller than the particle size R of the filler 90b. For example, if each slit of the metal layer 41 is set to have a length L of 4 μm and a width W of 2 μm in a case where the particle size R of the filler 90b is distributed in the range of 3 μm to 100 μm, the width W of each slit can be smaller than the particle size R of the filler 90b. Alternatively, it is desirable that the area of each slit of the metal layer 41 is smaller than 20% of the area of the metal layer 41. Accordingly, it is possible to lower a proportion at which microstress that transfers from the filler 90b passes through the slits and reaches the circuit elements of the analog circuit block 21.

Figure 3:
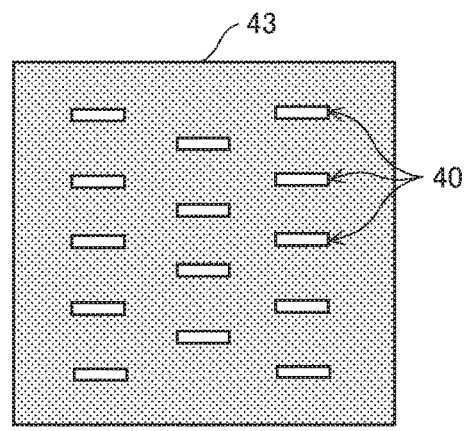
FIG. 3 is a plan view showing another example of the layout of slits in a metal layer.

FIG. 3 is a plan view showing another example of the layout of slits in a metal layer. The metal layers 41 and 42 shown in FIG. 1 are shaped such that all slits reach the edge of the metal layer 41 or 42. On the other hand, a metal layer 43 shown in FIG. 3 is shaped such that all slits are formed inside the region of the metal layer 43 and do not reach the edge of the metal layer 43. Alternatively, both of the slits shown in FIG. 1 and the slits shown in FIG. 3 may be formed in one metal layer.

Second Embodiment

Figure 4:
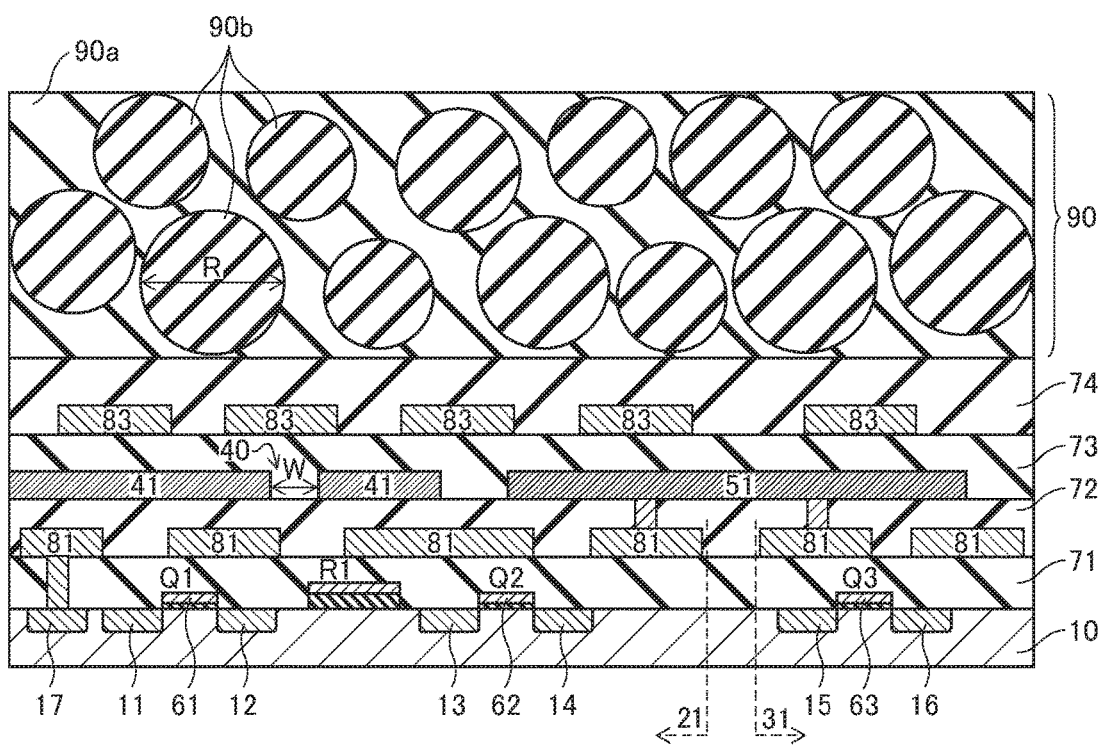
FIG. 4 is a cross-sectional view of a semiconductor device according to a second embodiment of the invention.

FIG. 4 is a cross-sectional view of a semiconductor device according to a second embodiment of the invention. In the second embodiment, the metal layer 41 is arranged not in the third interconnect layer but in the second interconnect layer. The other aspects of the configuration of the second embodiment may be similar to those of the first embodiment.

On the upper side of the inter-layer insulating film 72, a second interconnect layer including the metal layer 41 positioned above the analog circuit block 21, the intra-block interconnects 50 (see FIG. 1) positioned above the digital circuit block 31, and the inter-block interconnects 51 is arranged.

The intra-block interconnects 50 are electrically connected via through holes formed through the inter-layer insulating film 72, to the metal interconnects 81 of the digital circuit block 31. The inter-block interconnects 51 electrically connect the metal interconnects 81 of the analog circuit block 21 and the metal interconnects 81 of the digital circuit block 31, via through holes formed through the inter-layer insulating film 72. On the upper side of the inter-layer insulating film 72 on which the second interconnect layer is arranged, the inter-layer insulating film 73 is arranged.

On the upper side of the inter-layer insulating film 73, a third interconnect layer including a plurality of metal interconnects 83 is arranged. For example, the metal interconnects 83 of the third interconnect layer are used to supply a reference potential or a power source potential to a plurality of circuit blocks. In this manner, the metal layer 41 may be arranged in any interconnect layer among the plurality of interconnect layers, as long as it is not the first interconnect layer used for interconnecting the circuit elements. Since microstress that transfers from the filler 90b spreads apart in accordance with the distance, the lower the metal layer 41 is positioned, the more the proportion at which microstress that transfers from the filler 90b passes through the slits 40 and reaches the circuit elements of the analog circuit block 21 can be lowered.

Third Embodiment

Figure 5:
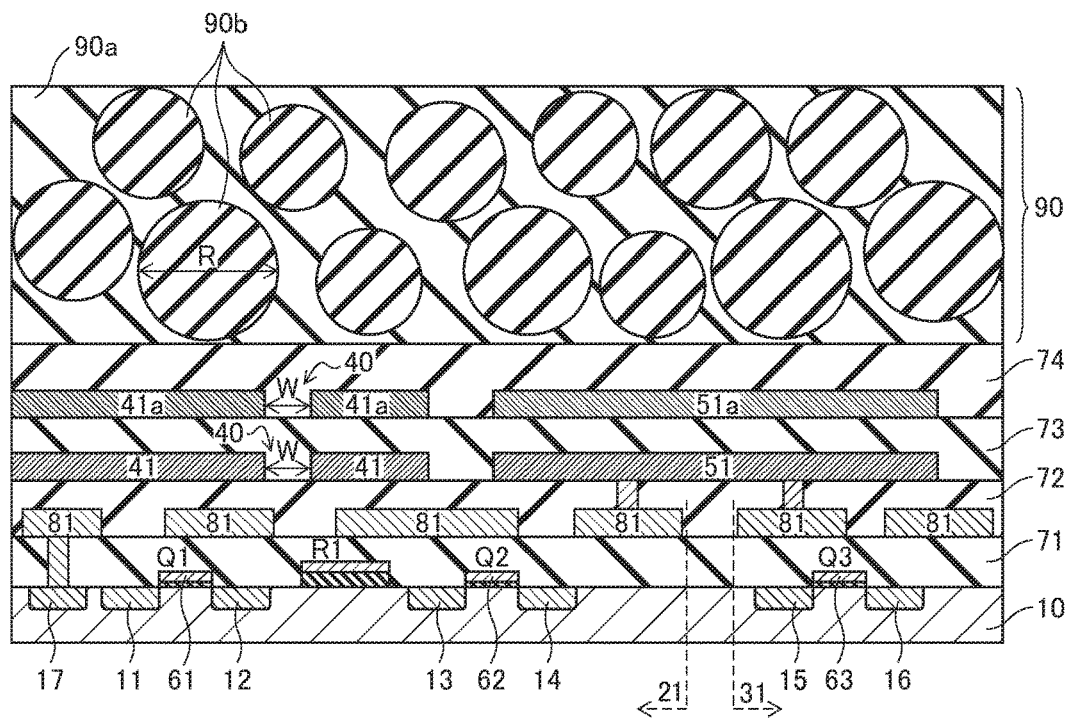
FIG. 5 is a cross-sectional view of a semiconductor device according to a third embodiment of the invention.

FIG. 5 is a cross-sectional view of a semiconductor device according to a third embodiment of the invention. In the third embodiment, a first metal layer 41 is arranged in the second interconnect layer, and a second metal layer 41a is arranged in the third interconnect layer. The other aspects of the configuration of the third embodiment may be similar to those of the first or second embodiment.

On the upper side of the inter-layer insulating film 72, a second interconnect layer including the first metal layer 41 positioned above the analog circuit block 21, first intra-block interconnects 50 (see FIG. 1) positioned above the digital circuit block 31, and first inter-block interconnects 51 is arranged.

The first intra-block interconnects 50 are electrically connected via through holes formed through the inter-layer insulating film 72, to the metal interconnects 81 of the digital circuit block 31. The first inter-block interconnects 51 electrically connect the metal interconnects 81 of the analog circuit block 21 and the metal interconnects 81 of the digital circuit block 31, via through holes formed through the inter-layer insulating film 72. On the upper side of the inter-layer insulating film 72 on which the second interconnect layer is arranged, the inter-layer insulating film 73 is arranged.

On the upper side of the inter-layer insulating film 73, a third interconnect layer including the second metal layer 41a positioned above the analog circuit block 21, second intra-block interconnects (not shown) positioned above the digital circuit block 31, and second inter-block interconnects 51a is arranged.

The third interconnect layer including the second metal layer 41a is made of, for example, aluminum (Al), aluminum alloy obtained by mixing approximately 0.5% of copper (Cu) in aluminum (Al), copper (Cu), or the like. The second metal layer 41a may not be electrically connected to other metal interconnects or circuit elements. Alternatively, the second metal layer 41a may be electrically connected to the semiconductor substrate 10 so that a substrate potential is applied thereto, or may be electrically connected to a metal interconnect to which a reference potential or a power source potential of the analog circuit block 21 is supplied.

The second intra-block interconnects are electrically connected via through holes formed through the inter-layer insulating film 73, to the first intra-block interconnects 50. The second inter-block interconnects 51a electrically connect interconnects (not shown) of the second interconnect layer electrically connected to the analog circuit block 21 and the first intra-block interconnects 50, via through holes formed through the inter-layer insulating film 73. In this manner, the metal layers may be arranged in a plurality of interconnect layers, as long as they are not the first interconnect layer used for interconnecting the circuit elements.

Fourth Embodiment

Figure 6:
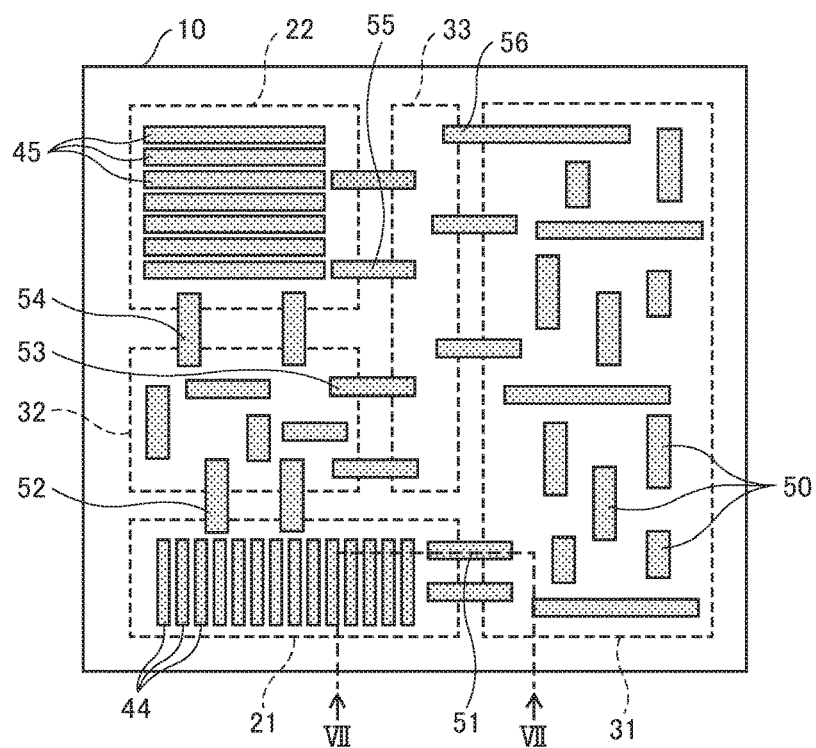
FIG. 6 is a plan view showing an example of the configuration of a semiconductor device according to a fourth embodiment of the invention.

FIG. 6 is a plan view showing an example of the configuration of a semiconductor device according to a fourth embodiment of the invention. Note that, in FIG. 6, in order to show the layout of a third interconnect layer, layers thereabove are omitted. In the fourth embodiment, a plurality of metal interconnects 44 and a plurality of metal interconnects 45 are arranged instead of the metal layers 41 and 42 shown in FIG. 1. The other aspects of the configuration of the fourth embodiment may be similar to those of the first embodiment.

In the semiconductor device, the third interconnect layer includes the plurality of metal interconnects 44 and the plurality of metal interconnects 45 positioned respectively above the analog circuit blocks 21 and 22, the plurality of intra-block interconnects 50 positioned above the digital circuit blocks 31 to 33, the plurality of inter-block interconnects 51 to 56, and the like. As shown in FIG. 6, the plurality of metal interconnects 44 are arranged in parallel, and the plurality of metal interconnects 45 are also arranged in parallel.

Each of the intra-block interconnects 50 is a metal interconnect for establishing electrical connection inside a digital circuit block. Each of the inter-block interconnects 51 to 56 and the like is a metal interconnect for electrically connecting a plurality of circuit blocks. The plurality of metal interconnects 44, the plurality of metal interconnects 45, and the other metal interconnects are made of, for example, aluminum (Al), aluminum alloy obtained by mixing approximately 0.5% of copper (Cu) in aluminum (Al), copper (Cu), or the like.

The plurality of metal interconnects 44 and the plurality of metal interconnects 45 function as buffer layers against compressive stress that is generated in the mold packaging process and transfers to the circuit elements of the analog circuit blocks 21 and 22. Furthermore, since the plurality of metal interconnects 44 are arranged in parallel and the plurality of metal interconnects 45 are also arranged in parallel, it is possible to uniformize stress that is generated from the plurality of metal interconnects 44 and the plurality of metal interconnects 45 and transfers to the circuit elements of the analog circuit blocks 21 and 22.

Figure 7:
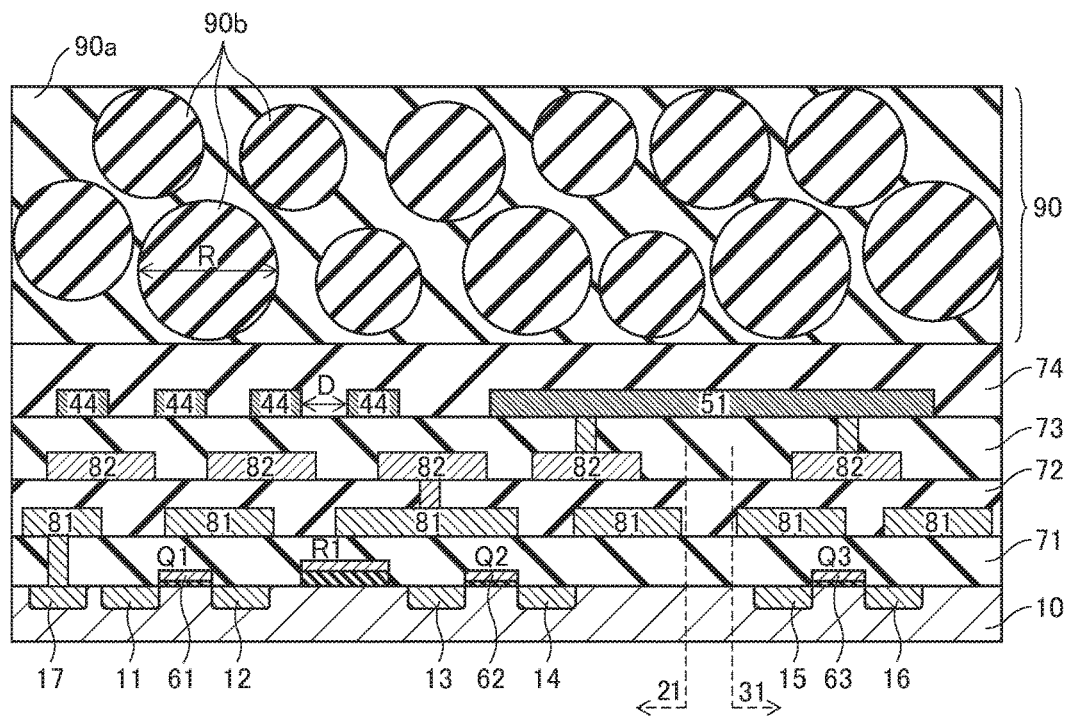
FIG. 7 is a cross-sectional view of the semiconductor device taken along the line VII-VII shown in FIG. 6.

FIG. 7 is a cross-sectional view of the semiconductor device taken along the line VII-VII shown in FIG. 6. FIG. 7 shows a part of the analog circuit block 21 and a part of the digital circuit block 31. For example, the analog circuit block 21 includes active elements such as the transistors Q1 and Q2 and a passive element such as the resistor R1 arranged on the semiconductor substrate 10. Furthermore, the digital circuit block 31 includes an active element such as the transistor Q3 arranged on the semiconductor substrate 10.

On the upper side of the inter-layer insulating film 73, a third interconnect layer including the plurality of metal interconnects 44 positioned above the analog circuit block 21, the intra-block interconnects 50 (see FIG. 1) positioned above the digital circuit block 31, and the inter-block interconnects 51 is arranged. The plurality of metal interconnects 44 may not be electrically connected to other metal interconnects or circuit elements.

The intra-block interconnects 50 are electrically connected via through holes formed through the inter-layer insulating film 73, to the metal interconnects 82 of the digital circuit block 31. The inter-block interconnects 51 electrically connect the metal interconnects 82 of the analog circuit block 21 and the metal interconnects 82 of the digital circuit block 31, via through holes formed through the inter-layer insulating film 73. Furthermore, on the upper side of the inter-layer insulating film 73 on which the third interconnect layer is arranged, the protective film 74 is arranged.

The thus configured semiconductor chip is sealed with the resin layer 90 in which the filler 90b is mixed in the resin 90a. Accordingly, the resin layer 90 is positioned above at least the plurality of metal interconnects 44, and may cover the upper face and the side faces of the semiconductor chip, or may cover the entire face of the semiconductor chip except for external connection terminals.

According to this embodiment, in the process that forms a third interconnect layer, the plurality of metal interconnects 44 are provided as a buffer layer above the analog circuit block 21, so that the non-uniformity of microstress that transfers from the filler 90b to the plurality of circuit elements of the analog circuit block 21 is suppressed, and the non-uniformity of the changes in the characteristics of the circuit elements is reduced. Accordingly, it is possible to suppress lowering of the level of precision of the electric characteristics of the analog circuit, and a variation in the characteristics and a change in the characteristics, in the mold packaging process, without using special materials or production methods.

Furthermore, in the mold packaging process, stress is generated also from the plurality of metal interconnects 44. Since the plurality of metal interconnects 44 are arranged in parallel, stress that is generated from the plurality of metal interconnects 44 and transfers to the plurality of circuit elements of the analog circuit block 21 is uniformized, so that the influence on the electric characteristics of the circuit elements can be mitigated.

In this case, it is desirable that a gap D between the plurality of metal interconnects 44 is smaller than the particle size R of the filler 90b. For example, if the gap D between the plurality of metal interconnects 44 is set to 2 μm in a case where the particle size R of the filler 90b is distributed in the range of 3 μm to 100 μm, the gap D between the plurality of metal interconnects 44 can be smaller than the particle size R of the filler 90b. Alternatively, it is desirable that the area of a region positioned between the plurality of metal interconnects 44 is smaller than 20% of the area of the plurality of metal interconnects 44. Accordingly, it is possible to lower a proportion at which microstress that transfers from the filler 90b passes through a portion between the plurality of metal interconnects 44 and reaches the circuit elements of the analog circuit block 21.

Fifth Embodiment

Figure 8:
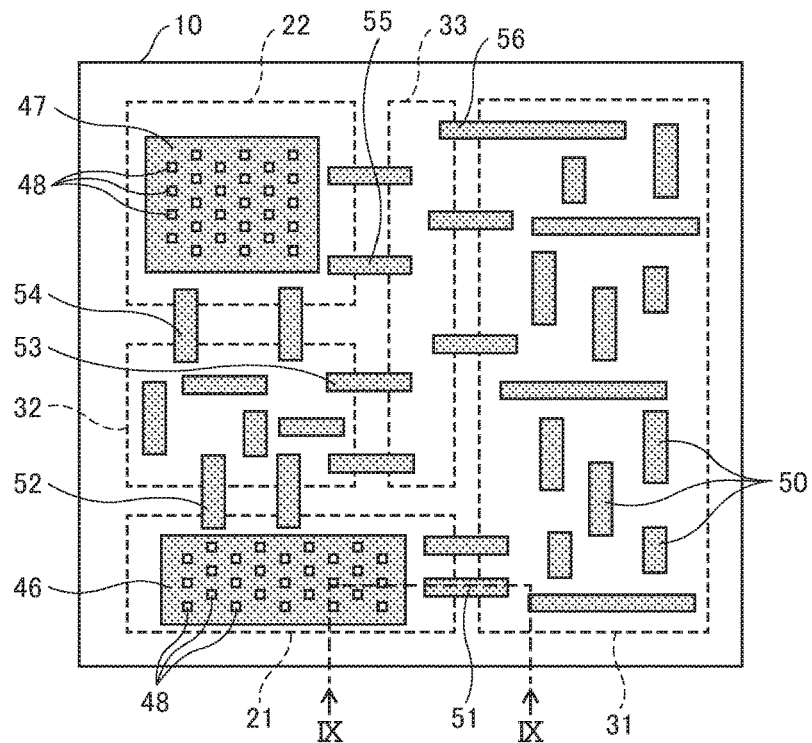
FIG. 8 is a plan view showing an example of the configuration of a semiconductor device according to a fifth embodiment of the invention.

FIG. 8 is a plan view showing an example of the configuration of a semiconductor device according to a fifth embodiment of the invention. Note that, in FIG. 8, in order to show the layout of a second interconnect layer, layers thereabove are omitted. In the fifth embodiment, first metal layers 46 and 47 are arranged in the second interconnect layer instead of the metal layers 41 and 42 shown in FIG. 1, and a second metal layer is arranged in the third interconnect layer. Furthermore, metal members (metal pillars) 48 that connect the first metal layers and the second metal layer are arranged. The other aspects of the configuration of the fifth embodiment may be similar to those of the third embodiment.

In the semiconductor device, the second interconnect layer includes the first metal layers 46 and 47 positioned respectively above the analog circuit blocks 21 and 22, the plurality of first intra-block interconnects 50 positioned above the digital circuit blocks 31 to 33, the plurality of first inter-block interconnects 51 to 56, and the like. As shown in FIG. 8, on the upper side of the first metal layers 46 and 47, the metal pillars 48 that fill through holes formed through the third inter-layer insulating film and connect the first metal layers and the second metal layer are arranged.

Each of the first intra-block interconnects 50 is a metal interconnect for establishing electrical connection inside a digital circuit block. Each of the first inter-block interconnects 51 to 56 and the like is a metal interconnect for electrically connecting a plurality of circuit blocks. The first and second metal layers, the metal pillars 48, and the metal interconnects are made of, for example, aluminum (Al), aluminum alloy obtained by mixing approximately 0.5% of copper (Cu) in aluminum (Al), copper (Cu), or the like. Alternatively, the metal pillars 48 may be made of tungsten (W), copper (Cu), or the like buried in through holes formed through the third inter-layer insulating film.

The first and second metal layers function as buffer layers against compressive stress that is generated in the mold packaging process and transfers to the circuit elements of the analog circuit blocks 21 and 22. Furthermore, the metal pillars 48 arranged between the first metal layers and the second metal layer can uniformize stress that is generated from the first and second metal layers and transfers to the circuit elements of the analog circuit blocks 21 and 22.

Figure 9:
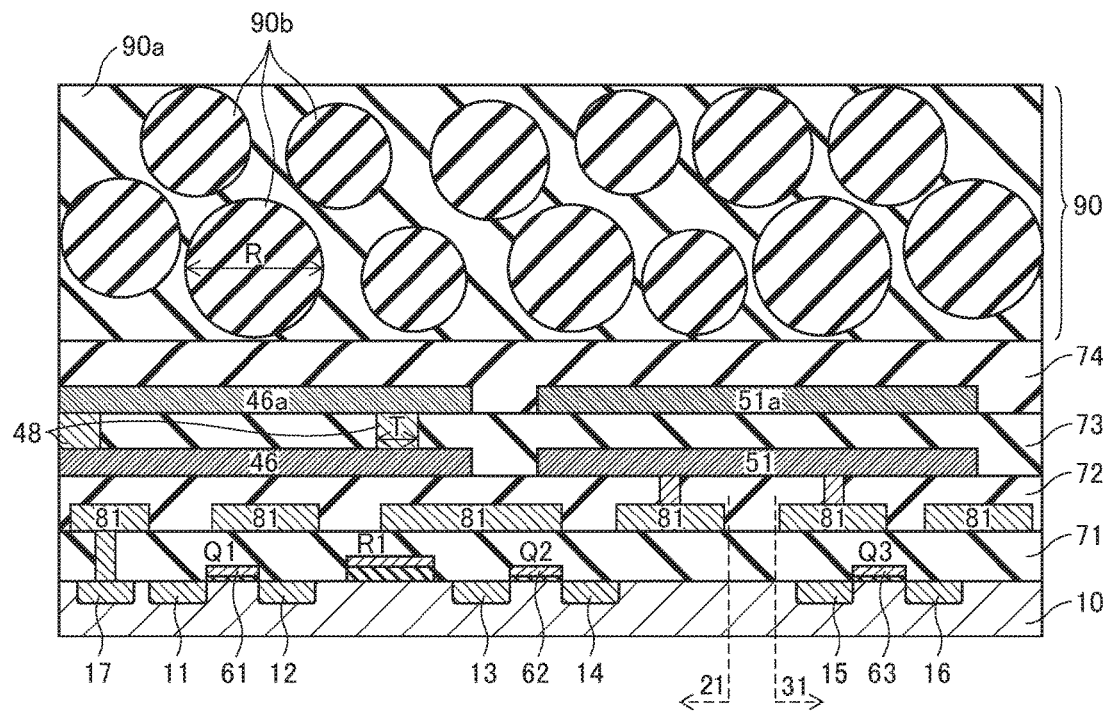
FIG. 9 is a cross-sectional view of the semiconductor device taken along the line IX-IX shown in FIG. 8.

FIG. 9 is a cross-sectional view of the semiconductor device taken along the line IX-IX shown in FIG. 8. FIG. 9 shows a part of the analog circuit block 21 and a part of the digital circuit block 31. For example, the analog circuit block 21 includes active elements such as the transistors Q1 and Q2 and a passive element such as the resistor R1 arranged on the semiconductor substrate 10. Furthermore, the digital circuit block 31 includes an active element such as the transistor Q3 arranged on the semiconductor substrate 10.

On the upper side of the inter-layer insulating film 72, a second interconnect layer including a first metal layer 46 positioned above the analog circuit block 21, the first intra-block interconnects 50 (see FIG. 1) positioned above the digital circuit block 31, and the first inter-block interconnects 51 is arranged. The first metal layer 46 may not be electrically connected to other metal interconnects or circuit elements. Alternatively, the first metal layer 46 may be electrically connected to the semiconductor substrate 10 so that a substrate potential is applied thereto, or may be electrically connected to a metal interconnect to which a reference potential or a power source potential of the analog circuit block 21 is supplied.

The first intra-block interconnects 50 are electrically connected via through holes formed through the inter-layer insulating film 72, to the metal interconnects 81 of the digital circuit block 31. The first inter-block interconnects 51 electrically connect the metal interconnects 81 of the analog circuit block 21 and the metal interconnects 81 of the digital circuit block 31, via through holes formed through the inter-layer insulating film 72. On the upper side of the inter-layer insulating film 72 on which the second interconnect layer is arranged, the inter-layer insulating film 73 is arranged.

On the upper side of the inter-layer insulating film 73, a third interconnect layer including a second metal layer 46a positioned above the analog circuit block 21, second intra-block interconnects (not shown) positioned above the digital circuit block 31, and the second inter-block interconnects 51a is arranged. The second metal layer 46a is positioned via the inter-layer insulating film 73 above the first metal layer 46, and is electrically connected via the metal pillars 48 that fill through holes formed through the inter-layer insulating film 73, to the first metal layer 46.

The second intra-block interconnects are electrically connected via through holes formed through the inter-layer insulating film 73, to the first intra-block interconnects 50. The second inter-block interconnects 51a electrically connect interconnects (not shown) of the second interconnect layer electrically connected to the analog circuit block 21 and the first intra-block interconnects 50, via through holes formed through the inter-layer insulating film 73. Furthermore, on the upper side of the inter-layer insulating film 73 on which the third interconnect layer is arranged, the protective film 74 is arranged.

The thus configured semiconductor chip is sealed with the resin layer 90 in which the filler 90b is mixed in the resin 90a. Accordingly, the resin layer 90 is positioned above at least the second metal layer 46a, and may cover the upper face and the side faces of the semiconductor chip, or may cover the entire face of the semiconductor chip except for external connection terminals.

According to this embodiment, in the process that forms a second interconnect layer, the first metal layer 46 is provided as a buffer layer above the analog circuit block 21. Furthermore, in the process that forms a third interconnect layer, the second metal layer 46a is provided as a buffer layer via the inter-layer insulating film 73 above the first metal layer 46. Accordingly, the non-uniformity of microstress that transfers from the filler 90b to the plurality of circuit elements of the analog circuit block 21 is suppressed, and the non-uniformity of the changes in the characteristics of the circuit elements is reduced. Accordingly, it is possible to suppress lowering of the level of precision of the electric characteristics of the analog circuit, and a variation in the characteristics and a change in the characteristics, in the mold packaging process, without using special materials or production methods.

Furthermore, in the mold packaging process, stress is generated also from the first metal layer 46 and the second metal layer 46a. The metal pillars 48 that connect the first metal layer 46 and the second metal layer 46a uniformize stress that is generated from the first metal layer 46 and the second metal layer 46a and transfers to the plurality of circuit elements of the analog circuit block 21, so that the influence on the electric characteristics of the circuit elements can be mitigated.

In this case, it is desirable that a width T of each metal pillar 48 is smaller than the particle size R of the filler 90b. For example, if the width T of each metal pillar 48 is set to 0.3 to 1.0 μm in a case where the particle size R of the filler 90b is distributed in the range of 3 μm to 100 μm, the width T of each metal pillar 48 can be smaller than the particle size R of the filler 90b. Accordingly, it is possible to lower a proportion at which microstress that transfers from the filler 90b passes via the metal pillars 48 and reaches the circuit elements of the analog circuit block 21.

Figure 10:
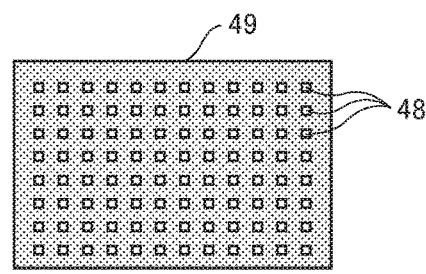
FIG. 10 is a plan view showing another example of the layout of metal pillars.

FIG. 10 is a plan view showing another example of the layout of metal pillars. In the first metal layer 46 or 47 shown in FIG. 8, the metal pillars 48 are arranged in an alternately displaced manner in adjacent rows and columns. On the other hand, in a metal layer 49 shown in FIG. 10, the metal pillars 48 are arranged in a grid in all rows and columns. Alternatively, both of the metal pillars shown in FIG. 8 and the metal pillars shown in FIG. 10 may be formed in one metal layer.

Furthermore, in the fifth embodiment, the first or second metal layer may have slits as in the metal layer 41 or 42 shown in FIG. 1 or the metal layer 43 shown in FIG. 3. Furthermore, three or more metal layers connected to each other via metal pillars may be arranged in the semiconductor device.

Electronic Apparatus

Next, an electronic apparatus according to an embodiment of the invention will be described.

Figure 11:
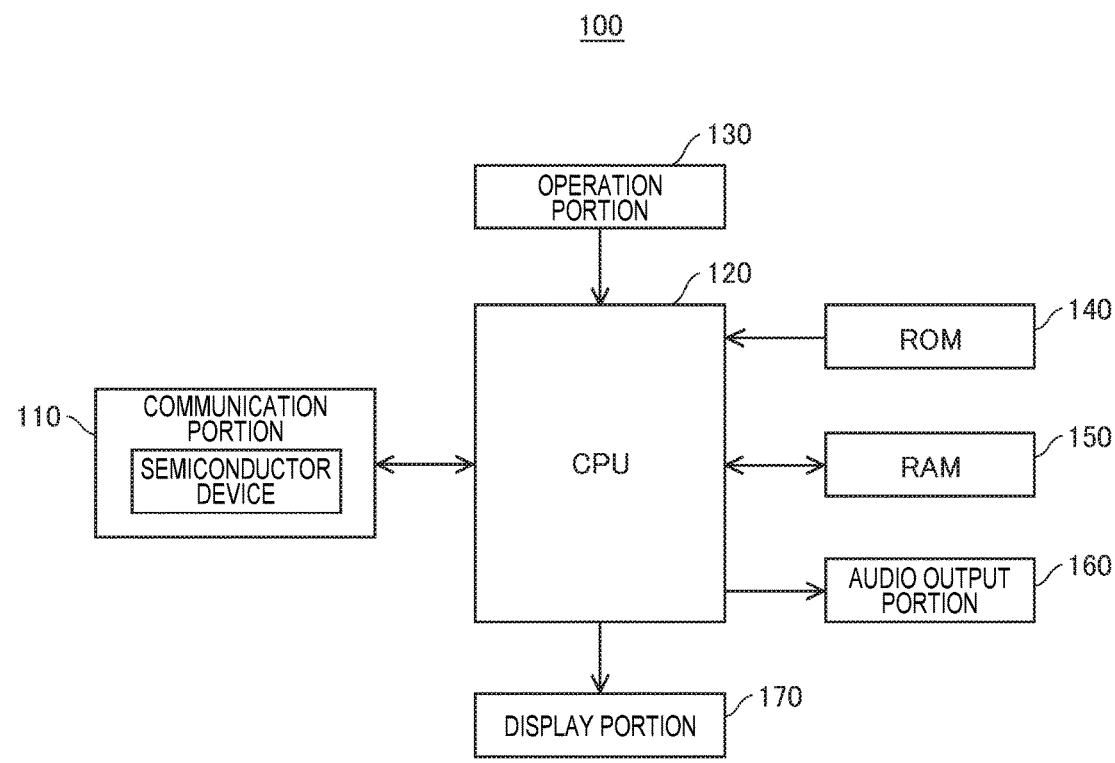
FIG. 11 is a block diagram showing an example of the configuration of an electronic apparatus according to an embodiment of the invention.

FIG. 11 is a block diagram showing an example of the configuration of an electronic apparatus according to an embodiment of the invention. As shown in FIG. 11, an electronic apparatus 100 includes a communication portion 110 using the semiconductor device according to any one of the embodiments of the invention, and may further include a CPU 120, an operation portion 130, a ROM (read only memory) 140, a RAM (random access memory) 150, an audio output portion 160, and a display portion 170. Note that, a part of the constituent elements shown in FIG. 11 may be omitted or changed, or other constituent elements may be added to the constituent elements shown in FIG. 11.

The communication portion 110 includes the semiconductor device according to any one of the embodiments of the invention. The semiconductor device may include a receiver circuit block, a transmitter circuit block, and a logic circuit block. For example, the receiver circuit block and the transmitter circuit block correspond to the analog circuit blocks 21 and 22 shown in FIG. 1 and the like, and the logic circuit block corresponds to the digital circuit block 31 shown in FIG. 1 and the like.

The receiver circuit block includes a low noise amplifier, a local oscillation circuit, a mixer, and a level detection circuit. The low noise amplifier amplifies a weak reception signal output from an antenna. The local oscillation circuit generates a local oscillation signal by performing an oscillation operation. The mixer outputs a baseband signal by converting the frequency of the reception signal using the local oscillation signal. The level detection circuit outputs a digital baseband signal by detecting the level of the analog baseband signal.

The transmitter circuit block includes a DAC (digital/analog converter), a modulation circuit, and a power amplifier. The DAC converts a digital modulation signal into an analog modulation signal. The modulation circuit outputs a transmission signal by modulating the local oscillation signal according to the analog modulation signal. The power amplifier amplifies the transmission signal and supplies it to the antenna.

The logic circuit block includes a digital demodulation circuit and a digital modulation circuit. The digital demodulation circuit obtains reception data by performing digital demodulation processing on the digital baseband signal output from the receiver circuit block, and supplies the obtained reception data to the CPU 120. The digital modulation circuit generates a digital modulation signal based on the transmission data supplied from the CPU 120, and outputs it to the transmitter circuit block.

The CPU 120 performs various types of signal processing and control processing using the reception data and the like supplied from the communication portion 110 in accordance with programs stored in the ROM 140 and the like. For example, the CPU 120 performs various types of signal processing and supplies transmission data to the communication portion 110 in accordance with operation signals supplied from the operation portion 130. Alternatively, the CPU 120 generates an audio signal for causing the audio output portion 160 to output various types of audio, or generates an image signal for causing the display portion 170 to display various images.

The operation portion 130 is, for example, an input device including operation keys, button switches, and the like, and outputs an operation signal to the CPU 120 according to an operation by the user. The ROM 140 stores programs, data, and the like for causing the CPU 120 to perform various types of signal processing and control processing. Furthermore, the RAM 150 is used as a working area for the CPU 120, and temporarily stores programs and data read from the ROM 140, data input using the operation portion 130, results of operation performed by the CPU 120 in accordance with programs, and the like.

The audio output portion 160 includes, for example, a loudspeaker and the like, and outputs audio according to an audio signal supplied from the CPU 120. Furthermore, the display portion 170 includes, for example, an LCD (liquid crystal display) and the like, and displays various types of information based on a display signal supplied from the CPU 120. Note that an image sensor portion including a solid state image sensor and the semiconductor device according to any one of the embodiments of the invention may be provided instead of the communication portion 110.

The electronic apparatus 100 can be used, for example, as mobile terminals such as mobile phones, smart cards, digital still cameras, digital movie cameras, video projectors, televisions, surveillance television monitors, head mounted displays, personal computers, printers, network devices, car navigation devices, measurement devices, medical devices, and the like.

According to this embodiment, it is possible to provide an electronic apparatus having stable electric characteristics with a high level of precision, using a semiconductor device in which lowering of the level of precision of the electric characteristics of an analog circuit, and a variation in the characteristics and a change in the characteristics in the mold packaging process are suppressed without using special materials or production methods.

In the foregoing embodiments, semiconductor devices having three interconnect layers were described, but various embodiments of the invention can be applied also to semiconductor devices having two, or four or more interconnect layers. In this manner, various embodiments of the invention are not limited to the foregoing embodiments, and many variations within the technical idea of the various embodiments of the invention can be made by those skilled in the art.

What is claimed is:

1. A semiconductor device comprising:
   a semiconductor substrate;
   an analog circuit block including an active element arranged in the semiconductor substrate;
   a metal layer with a serpentine structure, the metal layer having a slit that extends only partway through the metal layer, the metal layer positioned above the analog circuit block; and
   a resin layer containing a filler, positioned above at least the metal layer, wherein a width of the slit is smaller than a particle size of the filler.

2. The semiconductor device according to claim 1, wherein an area of the slit of the metal layer is smaller than 20% of an area of the metal layer.

3. An electronic apparatus comprising the semiconductor device according to claim 1.

4. The semiconductor device according to claim 1, further comprising:
   digital circuit blocks;
   a plurality of intra-block interconnects positioned above the digital circuit blocks; and
   a plurality of inter-block interconnects.

5. The semiconductor device according to claim 4, wherein the intra-block interconnects are metal interconnects for establishing electrical connection inside the digital circuit blocks, and the inter-block interconnects are metal interconnects for electrically connecting the plurality of digital circuit blocks.

6. The semiconductor device according to claim 4, wherein the metal interconnects comprise aluminum, an aluminum alloy obtained by mixing approximately 0.5% of copper in aluminum, or copper.

7. The semiconductor device according to claim 1, wherein the metal layer is not electrically connected to other metal interconnects or circuit elements.

8. The semiconductor device according to claim 1, wherein the metal layer is electrically connected to the semiconductor substrate so that a substrate potential is applied thereto.

9. The semiconductor device according to claim 1, wherein the metal layer is electrically connected to a metal interconnect to which a reference potential or a power source potential of the analog circuit block is supplied.

10. The semiconductor device according to claim 1, wherein the metal layer comprises aluminum, an aluminum alloy obtained by mixing approximately 0.5% of copper in aluminum, or copper.

11. The semiconductor device according to claim 1, wherein the resin layer comprises epoxy resin or a silica particle.

12. The semiconductor device according to claim 4, wherein the resin layer comprises epoxy resin or a silica particle.

\* \* \* \* \*